United States Patent [19]

Baumert

[11] Patent Number: 5,406,592
[45] Date of Patent: Apr. 11, 1995

[54] FIRST ORDER FLL/PLL SYSTEM WITH LOW PHASE ERROR

[75] Inventor: Robert J. Baumert, Allentown, Pa.
[73] Assignee: AT&T Corp., Murray Hill, N.J.
[21] Appl. No.: 100,522
[22] Filed: Jul. 30, 1993
[51] Int. Cl.⁶ .......................................... H03D 3/24
[52] U.S. Cl. .................................. 375/376; 327/114; 327/159
[58] Field of Search ............... 375/120, 97, 118, 119; 331/57, 10, 1 R; 328/155, 63, 133, 134, 138; 307/510, 511

[56] References Cited

U.S. PATENT DOCUMENTS

| | | | |
|---|---|---|---|
| 4,316,152 | 9/1979 | Meyer | 331/1 A |
| 4,418,318 | 11/1983 | Swagerty et al. | 328/155 |
| 4,590,602 | 5/1986 | Wolaver | 375/120 |
| 4,773,085 | 9/1988 | Cordell | 375/120 |
| 4,808,884 | 2/1989 | Hull et al. | 375/120 |
| 4,929,918 | 5/1990 | Chung et al. | 331/10 |
| 4,975,930 | 12/1990 | Shaw | 375/120 |
| 5,036,298 | 7/1991 | Bulzachelli | 331/23 |

Primary Examiner—Stephen Chin
Assistant Examiner—Tesfaldet Bocure
Attorney, Agent, or Firm—James H. Fox

[57] ABSTRACT

A circuit includes both a frequency locked loop (FLL) and a phase locked loop (PLL) to control the frequency and phase of a controlled oscillator with respect to a data signal. The FLL includes a frequency setting register that provides a digital control word to a digital-to-analog converter for causing the frequency of the controlled oscillator to equal the frequency of the data signal. The PLL has a phase detector for causing the phase of the controlled oscillator to approximate the phase of the data signal. The inventive circuit also includes a lock detector for determining whether the phase error between the controlled oscillator and the data signal is constant. When phase lock is achieved, a counter is enabled to count a periodic reference signal and to produce an overflow signal when a given count is exceeded. The overflow signal is selectively coupled to the frequency setting register in order to reduce the phase difference between the controlled oscillator and the data signal. In this manner, low phase error may be obtained in a first-order PLL system, thereby avoiding jitter peaking associated with second-order PLL systems.

15 Claims, 2 Drawing Sheets

FIRST ORDER FLL/PLL SYSTEM WITH LOW PHASE ERROR

BACKGROUND OF THE INVENTION

1. Field of the Invention

This invention relates to the use of a Phase-Locked Loop (PLL) in conjunction with a Frequency-Locked Loop (FLL), for use in digital communication systems and other applications.

2. Description of the Prior Art

When sending digital data over relatively long distances from one system to another, the source clock used to transmit the data needs to be recreated at the receiver in order to re-time the data. Using a PLL, or alternatively a PLL combined with a FLL to do this timing recovery is common practice. PLL's are feedback circuits where the phase of an incoming signal is compared to an internal signal using a circuit known as a phase detector. The output of this comparison is fed into the internal signal generator, often called the voltage controlled oscillator (VCO), which then adjusts its frequency to be closer to the incoming frequency. Often the phase detector output is filtered such that the VCO correction does not respond immediately to the latest input. The circuit used to do this filtering is known as a loop filter. A PLL system that uses a loop filter is known as a second order PLL because of the mathematical representation of this feedback system. A PLL system with no loop filter is known as a first order PLL for the same reason.

One consequence of a second-order PLL is that its frequency response to jitter (i.e. phase modulation of the incoming data) can have a magnitude that is greater than unity for some frequency ranges. This is known a jitter peaking, and can have negative consequences in digital communication systems. This is because as data gets passed from one re-timing circuit to the next, the magnitude of the jitter at these frequencies is amplified. This ultimately negatively affects overall system performance. Designers of PLL's used in these types of applications often go to great lengths to insure that their circuit has minimal jitter peaking; see, for example, U.S. Pat. No. 5,036,298. However, this often causes them to make compromises in other aspects of the PLL's performance. A first order PLL has no jitter peaking by definition. However, it has several undesirable characteristics. One is that it can achieve phase lock at an arbitrarily large phase error. This can result in the system being on the edge of losing phase lock, at which point errors in the data received will result. Another undesirable characteristic is that it does not filter high frequency jitter that is on the data. Finally a first order system will have worse data dependent jitter because of the drift in phase that will occur between phase corrections. A second order system can be designed to have near zero phase error, filter out high frequency jitter and have low data dependent jitter.

The addition of an FLL to the PLL, referred to as a FLL/PLL herein, can create a system where the FLL does adjustment to the VCO based on frequency information of the incoming signal compared to the VCO; see, for example, U.S. Pat. No. 4,773,085. A system can be designed using this approach whereby the FLL does the early correction over a relatively wide range of frequencies. This lessens the performance needs of the PLL and can thus make the PLL design job easier. As is further known in the art, PLL's can be built as 1) all analog, 2) mixed analog and digital or 3) all digital. The significant advantage of analog designs, and potentially mixed analog and digital designs, is that they can recover clock at data rates that are very high. But the design and manufacture of analog parts is usually more difficult Also, they can require additional parts on a board such as discrete filter components. The all-digital approach has the advantage that it is easy to design, build and use, although it typically achieves clock recovery at lower data rates than the analog technique.

SUMMARY OF THE INVENTION

I have invented a technique to control the frequency and phase of a controlled oscillator with respect to a data signal. A frequency locked loop (FLL) includes a frequency setting register that provides a digital control word to a digital-to-analog converter for causing the frequency of the controlled oscillator to approximate the frequency of the data signal. A phase locked loop (PLL) has a phase detector for causing the phase of the controlled oscillator to approximate the phase of the data signal. A lock detector determines whether the phase error between the controlled oscillator in the FLL/PLL system and the data signal is constant. When phase lock is achieved, a counter is enabled to count a periodic reference signal and to produce an overflow signal when a given count is exceeded. The overflow signal is selectively coupled to the frequency setting register in order to reduce the phase difference between the controlled oscillator and the data signal.

DETAILED DESCRIPTION

Figure 1:
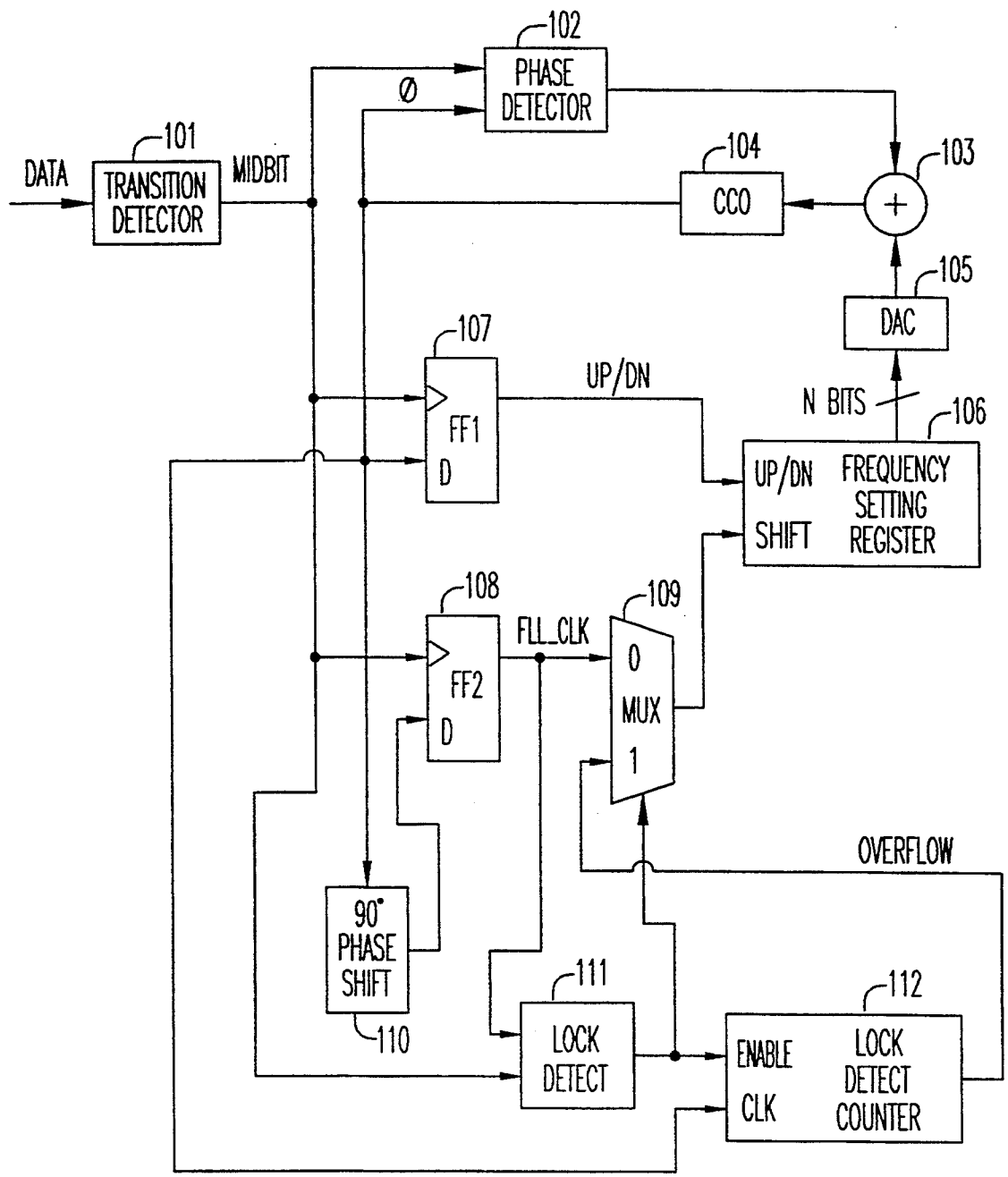
FIG. 1 shows an illustrative system that embodies the invention.

The following detailed description relates to a first-order FLL/PLL system that is capable of having low phase error at lock while maintaining the benefits of no jitter peaking inherent with a first-order PLL. In a typical implementation in CMOS integrated circuit technology, it is easy to design and manufacture. An overall system block diagram detailing an illustrative embodiment of the invention is given in FIG. 1. The PLL and FLL share the same current controlled ring oscillator (CCO) in the embodiment shown. However, a voltage controlled oscillator (VCO) may alternatively be used. The PLL includes a phase detector (102) and the CCO (104), making it a first-order PLL. The phase detector 102 provides a current (or voltage when using a VCO) that is proportional to the phase difference $\phi$ between the signal MIDBIT and the output of the CCO. The signal MIDBIT is derived from, and has the same frequency as, the DATA signal as described below. For purposes of the present description, MIDBIT is considered a "data" signal when considering the reduction of phase error. The FLL includes a phase detector (flip-flop 107), a quadrature phase detector (flip-flop 108 and phase shifter 110), a frequency setting register (106), a digital-to-analog converter (105), and the CCO (104). The DATA input is coupled to the PLL and FLL via a transition detector (101). The combination of a PLL and FLL as thus described is a conventional type known in the art.

The FLL/PLL circuit works in the following manner: Prior to data being applied to the input of the circuit, the CCO (104) is running at its reset, or last known, frequency. Assume that data is then applied at a data rate that is relatively far from the CCO frequency. A reference edge (MIDBIT) is optionally derived from the input signal DATA by means of transition detector 101, typically at a time that is half of the current CCO period after the edge of DATA. The MIDBIT reference edge is used as the clock to FF1 and FF2. FF1 gets the local CCO clock as its data (D) input. FF2 gets the local CCO clock delayed by ¼ of its period (90 degrees) as its data (D) input. The UP/DN output of FF1 (107) is used as the up/down input to the frequency setting register (106). The output of FF2 (FLL_CLK) is used as the clock input to the same register. Because the data input rate is so far from the CCO frequency, the PLL can't hold lock and there is continual phase drift through a full 360 degrees. The resultant waveforms UP/DN and FLL_CLK will drive the frequency setting register in one direction if the frequency is too slow, and in the opposite direction if the frequency is too fast. There will be one FLL_CLK positive edge every 360 degrees of phase drift (slip) and therefore there will be one CCO frequency adjustment made per slip. The output of the frequency setting register is an N-bit word that is fed into the DAC (105), which generates an analog current proportional to the N-bit word value. This analog current is added to the current from the PLL and input to the CCO by means of current adder 103.

This process continues such that every phase rotation through 360 degrees, the FLL will update the CCO to closer to the correct frequency. Eventually the frequency is close enough so that the PLL is capable of holding phase lock. That is, the phase error achieves a steady-state value. When this occurs there will no longer be a 360 degree drift of phase and therefore the FLL will no longer update the CCO frequency. The PLL operation is as follows. The MIDBIT reference edge is compared with the CCO clock edge using a phase detector (102). The output of the phase detector is a current which drives the CCO faster or slower depending on the result of the phase comparison. The time that this current is on is exactly the difference in time between the two edges that were compared. The net result is a short term speed up or slow down of the CCO, resulting in a smaller phase difference. For the interval of time that no correction is being made, the phase of the incoming data and the CCO clock drift relative to each other at a rate which is proportional to their frequency difference. When phase lock is achieved, the mount of phase drift and the amount of phase correction are exactly equal. However, the phase error ($\phi$) between the output of the CCO and the signal MIDBIT is not necessarily zero. In fact, the phase error may be close to the extremes of plus or minus 180 degrees, in which case any system timing jitter or noise could cause the PLL to lose lock. That could lead to undesirable system performance in some cases.

The present invention provides for reducing the phase error, typically to approximately zero degrees. In order to implement the present invention, additional control circuitry is included with the PLL and FLL. This additional control circuitry comprises a lock detector (111), a counter (112), and a multiplexer (109) in the embodiment shown. The circuit works in the following manner: When data first enters this system, it may be very far from the correct frequency, resulting in rapid phase drift and no phase lock. The FLL corrects based on signals generated due to the rapid phase drift. Therefore, at first the FLL corrects very rapidly and quickly drives the CCO to the correct frequency. As the CCO nears the correct frequency, the FLL activity gradually reduces until the frequency is so Close that the PLL can hold phase lock. However, as noted above, the magnitude of the phase error at lock can be arbitrarily high, and is a function of the frequency error. If at lock the frequency error could be reduced even further, then the phase error would be reduced as well. This argument can be extended such that if the frequency error can be made zero then the phase error would also be zero. The description below shows how the additional control circuitry can reduce the frequency error at lock.

At some point the lock detector (111) senses that phase lock has been achieved and sets a flag to indicate this, thereby activating the ENABLE input of the lock detect counter (112). As long as the ENABLE input signal is activated, the counter (112) will continually count and overflow at the rate which is a function of the size of the counter. This overflow signal (OVERFLOW) is used as the signal to update the FLL frequency setting register (106). In addition, setting the lock detector flag also causes the multiplexer 109 to select the OVERFLOW output of the lock detect counter 112, in lieu of the FLL_CLK signal from FF2 (108) that is used to achieve lock at noted above. While at lock, the output of the FF1 flip-flop indicates on which side of zero phase the CCO clock is currently sitting. This is indirectly a measure of whether the frequency is too fast or too slow. Therefore using this as the up/down input to the FLL frequency setting register (106) and as mentioned above the OVERFLOW signal as the clock to the same counter, the CCO frequency will gradually be driven to the most accurate setting. This results in near zero phase error. To account for the possibility of a highly jittered data input signal, the output of FF1 may optionally be filtered by feeding it into an up/down counter to provide an integrated measure of the sign of the phase error. The output of this filter counter is then used as the up/down input to the frequency setting register (106).

The N-bit output word is supplied from the frequency setting register (106) to the digital-to-analog converter (105), and the frequency adjustment is made by incrementing or decrementing the N-bit output word. The rate at which this update occurs is programmable via the lock detect counter size and can be made arbitrarily large. It can also be made a function of time since lock has been achieved. In other words, the system can be designed so that the update of the CCO frequency happens frequently soon after lock has been detected, and the updating is infrequent long after lock has been detected.

In the case where there is high frequency jitter and the system is near zero phase error, the instantaneous phase error information can be random and cause incorrect decisions to be made about the frequency error. However, with the present invention, the phase error information can be put into an optional up/down phase counter (not shown). The optional up/down phase counter integrates the phase error information to give a more accurate long term indication of frequency error.

This should not be viewed as a digital loop filter however, because the frequency update is not based on the time when the up/down phase counter overflows. The frequency update happens at the rate determined by the lock detect counter. The optional up/down phase counter provides only the direction information.

Figure 2:
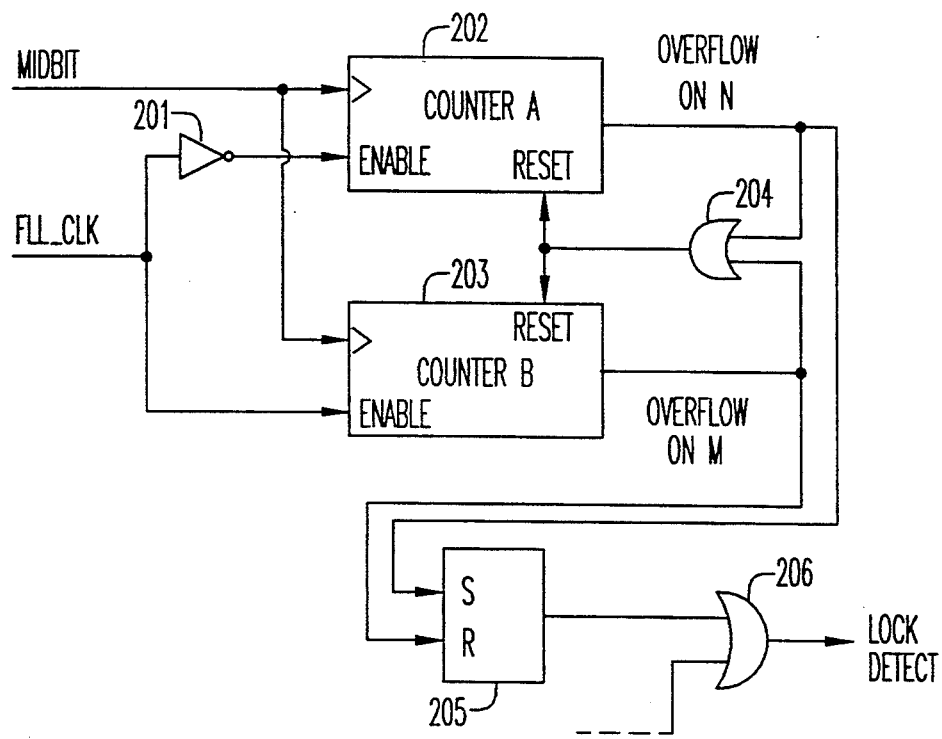
FIG. 2 shows details of one embodiment of the lock detector.

One useful embodiment of the lock detector (111) is shown in FIG. 2, with other types, including analog types, being possible. The counter A (202) is relatively large, illustratively 128 bits, and is enabled when the phase error ($\phi$) is within plus or minus 90 degrees. The counter B (203) is relatively small, illustratively 16 bits, and is enabled when $\phi$ is outside of the plus or minus 90 degree range. While slip is happening (i.e., the CCO frequency is not equal to the DATA frequency), counters A and B are enabled for approximately the same mount of time. Therefore, B will overflow before A (because B is smaller than A), and both A and B will be reset through gate 204. Hence, the RS flip-flop 205 will remain reset, having an output that remains low. However, when at lock, and in the plus or minus 90 degree region, counter A counts while B doesn't. Thus, at lock, A will overflow and set the RS flip-flop 205, providing a high input to OR gate 206, thereby setting the LOCK DETECT output signal high. To provide for the case in which lock occurs in the range of plus or minus 90 to 180 degrees, an additional set of counters comparable to A and B, an associated circuitry, are also provided, but not shown for simplicity of illustration. The additional counter comparable to A is made small (e.g., 16 bits), whereas the counter comparable to B is made large (e.g., 128 bits). The output of the additional RS flip-flop then drives the other input of OR gate 206, so that LOCK DETECT goes high when lock occurs in that range also.

Figure 3:
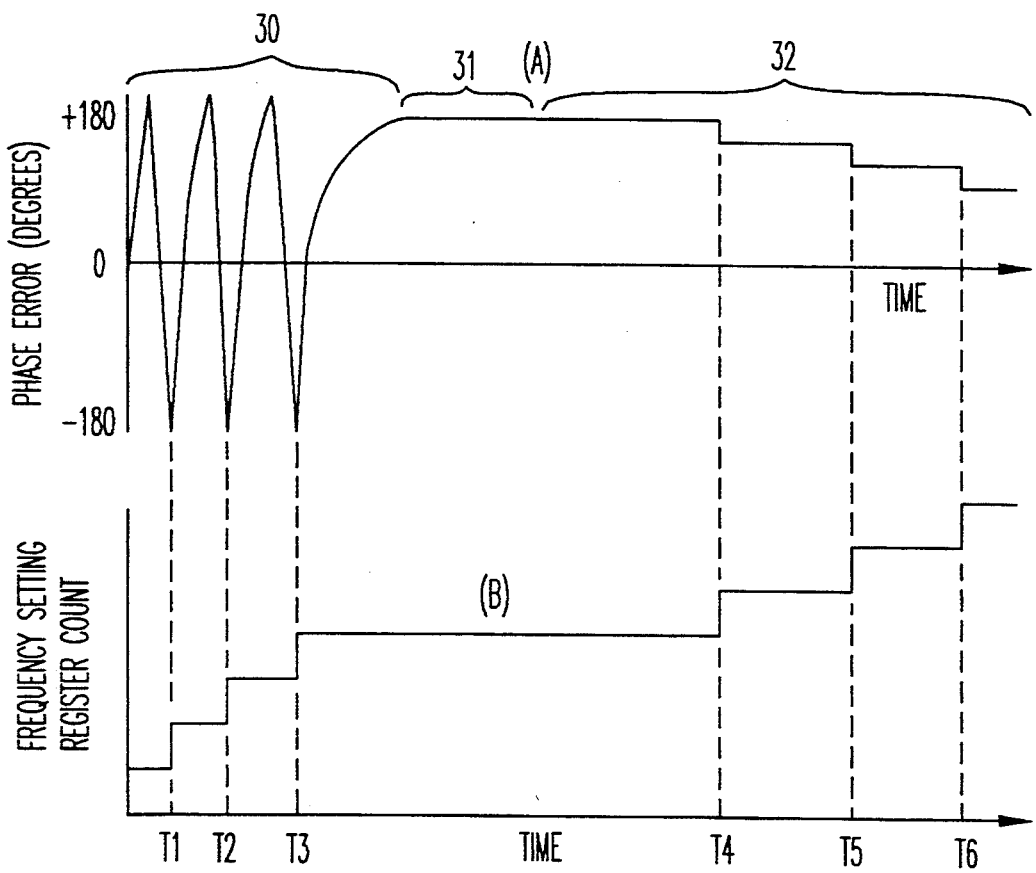
FIG. 3 shows typical waveforms during a lock-in sequence.

Referring to FIG. 3, a typical lock-in operation is illustrated. The top graph (A) shows the phase error angle $\phi$, which is the phase angle between the signals MIDBIT and the output of the CCO (FIG. 1). When $\phi=0$, then the phase difference is zero. The non-zero values of $\phi$ range up to plus or minus 180 degrees. The bottom graph (B) shows the count (i.e., value of the N-bit word) of the frequency setting register (106). During the initial period 30 before lock is achieved, the phase error oscillates between $-180$ degrees and $+180$ degrees. In the initial phase lock period 31, the FLL/PLL system has caused the frequency of the CCO to match that of the DATA signal. However, the lock detector has not immediately determined that lock has occurred, until period 32. Then, the circuitry of the present invention causes the phase error to be reduced in steps, at times T4, T5, T6, etc., until approximately zero phase error is achieved. In the illustrative case, this is achieved by increasing the value of the frequency setting register count, being the value of the N-bit word. Of course, depending on the phase error, the value of the frequency setting register count may alternatively be reduced in steps in order to reduce the phase error.

Although the present invention may be implemented in a single integrated circuit, other implementations with multiple integrated circuits are possible. Systems that utilize the inventive technique may achieve advantages in terms of reduced error rates for data transmissions, which may allow for higher data rates and other advantages. For example, if the FLL is capable of achieving very fine resolution of adjustment, then the PLL can as a side benefit be reduced in strength. This results in reduced jitter transfer through the first order PLL. Also, if the final frequency setting is very accurate, the data dependent jitter is greatly reduced. Therefore, a system implementing the inventive technique can have no jitter peaking because of the first order PLL, and have near zero phase error because of the FLL and the additional control circuitry. Still other benefits may accrue.

I claim:

1. An integrated circuit including a frequency locked loop having a frequency setting register that provides a digital control word to a digital-to-analog converter for causing the frequency of a controlled oscillator output to approximate the frequency of a data signal, and also including a phase locked loop having a phase detector for causing the phase of said controlled oscillator output to approximate the phase of said data signal, Characterized in the said integrated circuit further comprises a lock detector having an output that provides an enable signal when phase lock has been achieved between said controlled oscillator output and said data signal; a counter having a first input coupled to the output of said lock detector and enabled by said enable signal to count a periodic reference signal applied to a second input of said counter, and to produce an overflow signal when the count value exceeds a threshold value; and wherein said overflow signal is selectively coupled to an input of said frequency setting register when said phase lock has been achieved in order to reduce the phase difference between said controlled oscillator output and said data signal.

2. The integrated circuit of claim 1 wherein said periodic reference signal is the output of said controlled oscillator.

3. The integrated circuit of claim 1 wherein said frequency locked loop further comprises a first flip-flop having a clock input that is clocked by said data signal, a data input that is directly coupled to the output of said controlled oscillator, and an output that is coupled to an up/down input of said frequency setting register for determining whether said overflow signal causes said frequency setting register to be incremented or decremented.

4. The integrated circuit of claim 1 wherein said frequency locked loop further comprises a second flip-flop having a clock input that is clocked by said data signal, a data input that is coupled to the output of said controlled oscillator by means of a 90 degree phase shifter, and an output that is selectively coupled to said frequency setting register when said frequencies are unequal in order to reduce the frequency difference between said controlled oscillator and said data signal.

5. The integrated circuit of claim 1 further comprising a summing circuit that sums a first output signal from said phase detector and a second output signal from said digital-to-analog converter in order to produce a control signal that controls the frequency of said controlled oscillator.

6. The integrated circuit of claim 1 wherein said controlled oscillator is a current controlled oscillator.

7. The integrated circuit of claim 1 wherein said controlled oscillator is a voltage controlled oscillator.

8. A circuit comprising:
a frequency locked loop having a frequency setting register that provides a digital control word to a digital-to-analog converter that provides a first signal to a controlled oscillator for causing the frequency of the output of said controlled oscillator to approximate the frequency of a data signal, wherein said frequency setting register has an up/-down input for controlling whether the value of the control word is incremented or decremented, and also has a shift input for causing the value of the control word to be changed;

and a phase locked loop having a phase detector that provides a second signal for causing the phase of the output of said controlled oscillator to approximate the phase of said data signal;

and first and second flip-flops each having a clock input coupled to receive said data signal; with said first flip-flop having a data input coupled to the output of said controlled oscillator, and having an output coupled to said up/down input of said frequency setting register; and with said second flip-flop having a data input coupled to the output of said controlled oscillator through a 90 degree phase shifter, and having an output coupled to a first input of a multiplexer;

and a lock detector having a first input coupled to said data signal and a second input coupled to said output of said second flip-flop, and having an output coupled to control the state of said multiplexer;

and a lock detect counter having an enable input coupled to the output of said lock detector, and a clock input coupled to the output of said controlled oscillator, and having an overflow output coupled to a second input of said multiplexer;

and wherein the output of said multiplexer is coupled to said shift input of said frequency setting register.

9. A digital communication system including a frequency locked loop having a frequency setting register that provides a digital control word to a digital-to-analog converter for causing the frequency of a controlled oscillator output to approximate the frequency of a data signal, and also including a phase locked loop having a phase detector for causing the phase of said controlled oscillator output to approximate the phase of said data signal, Characterized in the said system further comprises a lock detector having an output that provides an enable signal when phase lock has been achieved between said controlled oscillator output and said data signal; a counter having a first input coupled to the output of said lock detector and enabled by said enable signal to count a periodic reference signal applied to a second input of said counter, and to produce an overflow signal when the count value exceeds a threshold value; and wherein said overflow signal is electively coupled to an input of said frequency setting register when said phase lock has been achieved in order to reduce the phase difference between said controlled oscillator output and said data signal.

10. The system of claim 9 wherein said periodic reference signal is the output of said controlled oscillator.

11. The system of claim 9 wherein said frequency locked loop further comprises a first flip-flop having a clock input that is clocked by said data signal, a data input that is directly coupled to the output of said controlled oscillator, and an output that is coupled to an up/down input of said frequency setting register for determining whether said overflow signal causes said frequency setting register to be incremented or decremented.

12. The system of claim 9 wherein said frequency locked loop further comprises a second flip-flop having a clock input that is clocked by said data signal, a data input that is coupled to the output of said controlled oscillator by means of a 90 degree phase shifter, and an output that is selectively coupled to said frequency setting register when said frequencies are unequal in order to reduce the frequency difference between said controlled oscillator and said data signal.

13. The system of claim 9 further comprising a summing circuit that sums a first output signal from said phase detector and a second output signal from said digital-to-analog converter in order to produce a control signal that controls the frequency of said controlled oscillator.

14. The system of claim 9 wherein said controlled oscillator is a current controlled oscillator.

15. The system of claim 9 wherein said controlled oscillator is a voltage controlled oscillator.

* * * * *